United States Patent
Yu et al.

(12)

(10) Patent No.: US 6,756,168 B2
(45) Date of Patent: Jun. 29, 2004

(54) DETERMINING EXPOSURE TIME OF WAFER PHOTOLITHOGRAPHY PROCESS

(75) Inventors: Jiunn Yann Yu, Hsinchu (TW); Chi Jui Yeh, Hsinchu (TW); Kam Tung Li, Hsinchu (TW)

(73) Assignee: Mosel Vitelic, Inc., Hsinchu (TW)

( * ) Notice: Subject to any disclaimer, the term of this patent is extended or adjusted under 35 U.S.C. 154(b) by 156 days.

(21) Appl. No.: 10/218,376

(22) Filed: Aug. 12, 2002

(65) Prior Publication Data

US 2003/0036270 A1 Feb. 20, 2003

(30) Foreign Application Priority Data

Aug. 16, 2001 (TW) ........................................ 90120147 A

(51) Int. Cl.$^7$ ................................................. G03F 9/00
(52) U.S. Cl. ............................................. 430/30; 716/2
(58) Field of Search ................................ 430/30; 716/2

(56) References Cited

U.S. PATENT DOCUMENTS 6,156,463 A * 12/2000 Saka ............................ 430/30
6,599,670 B2 * 7/2003 Ikuno et al. .................. 430/30

* cited by examiner

*Primary Examiner*—Christopher G. Young
(74) *Attorney, Agent, or Firm*—Towsend and Towsend and Crew LLP

(57) ABSTRACT

Embodiments of the present invention relate to a method and a system for determining an exposure time of a wafer photolithography process is applied to a wafer photolithography system and is used to determine the preferred exposure time for the L(N) batch production wafer. In one embodiment, at least three batches of the batch test wafers are recalled in a time sequence and the corresponding test values are obtained. A mean value of the test values corresponding to the at least three batches of the batch test wafers is calculated with a predetermined mathematical model. The calculated mean value is compared with a predetermined qualified examination value, and a margin value between the mean value and the qualified examination value is thus determined to adjust and generate an appropriate process exposure time. The preferred process exposure time is then employed as the exposure time of the L(N) batch production wafer. In this way, the trend of parameter variations of the entire system in the wafer photolithography process can be captured so that conservative adjustments upon the process exposure time can be achieved to reduce the influences of system perturbations.

20 Claims, 4 Drawing Sheets

DETERMINING EXPOSURE TIME OF WAFER PHOTOLITHOGRAPHY PROCESS

CROSS-REFERENCES TO RELATED APPLICATIONS

This application claims priority from R.O.C. patent application Ser. No. 090120147, filed Aug. 16, 2001, the entire disclosure of which is incorporated herein by reference.

BACKGROUND OF THE INVENTION

The present invention relates to a method for determining an exposure time of a wafer photolithography process, and more particularly to a method for determining the wafer exposure time by analyzing the exposure times of at least previous three batches of production wafers, to reduce the effects of parameter perturbations of facilities and materials.

In semiconductor manufacturing, the photolithography process is an important step, which can include several procedures of dehydration baking, priming, photoresisting, soft baking, exposing, post exposure baking, developing and hard baking, etc. Among those procedures, the exposure procedure is the subject matter of this invention.

The purpose of wafer exposure in the art is to have the photoresist layered over the surface of the wafer to undergo an effective photochemical transformation after absorbing adequate energy, and thereby to enable the developed photoresist to accurately transfer the pattern on the mask onto the wafer for being ready to perform a subsequent etching process. Two of the major operation conditions for the exposure energy control are exposure intensity and exposure time (ET), both of which can directly affect the process yield after wafer etching.

In the wafer photolithography and subsequent etching processes, factors perturbing the wafer exposure energy or the exposure process yield are numerous and can include almost all the operation parameters of each procedure in the entire photolithography process. Some of the crucial factors are photoresist material, photoresist thickness, soft bake extent, development condition, tolerance error of photoresist line width after developed, batch wafer condition, parameter perturbations of machine facilities, and the like. Consequently, in the batch wafer photolithography process, the exposure condition thereof should be adjusted frequently to meet the changes of disturbances or diminutive perturbations which affect the exposure parameters.

In order to control the yield of the photolithography process, it is common to sample the production wafers after completion of one batch photolithography process in the production line for fabricating a test wafer and to take the critical dimension (CD) of the etching line width of the test wafer as a criterion for evaluating the process yield. If the CD value is specs-in (i.e., qualified), the photolithography and etching processes can follow the original exposure conditions. If the CD value is specs-out (i.e., unsatisfied), the photolithography parameters will need to be adjusted (in particular, the exposure time thereof needs to be adjusted). However, in the case that the CD value deviates significantly from the standard, it obviously indicates the need for trouble shooting of the entire photolithography process so as to locate the problem. Regardless of the cause of the perturbations of the system, the yield can usually be adjusted through controlling the exposure time.

To more clearly manifest the time sequential relationship between the inspection line for examining the test wafer and the production line of the production wafer for the photolithography process as a function of time, FIG. 1 shows a schematic diagram of the time sequential relationship of the wafer photolithography production line and the test wafer inspection line among batches.

As shown in FIG. 1, the block L(N) in the production line denotes the photolithography process for the N batch wafer and the block T(N) in the inspection line denotes the examination process for the N batch wafer. The time axis extending from the left side of FIG. 1 to the right side thereof represents the time evolution. As shown in FIG. 1, the exposure condition, on which the manufacture of the L(N) batch production wafer in the production line is based, comes from the T(N−2) batch test wafer. The T(N−2) batch test wafer is sampled from the L(N−2) batch production wafer.

In the above-mentioned process time sequence, while the T(N−2) batch test wafer is under process examination in the inspection line, the photolithography process of the L(N−1) batch production wafer in the production line is simultaneously progressing under the exposure condition on basis of the examination from the T(N−3) batch test wafer. Meanwhile, as seen in FIG. 1, the T(N−3) batch test wafer is sampled from the L(N−3) batch production wafer.

The aforesaid method for determining the wafer photolithography exposure condition is carried out in the manner of "spacing one batch production wafer." The feature of such a method resides in that, for the system composed of the production line and the inspection line, two independent groups are formed: an odd-batch group (including the production wafers and the test wafers of each batch linking with a center line in FIG. 1) and an even-batch group (including the production wafers and the test wafers of each batch linking with a dotted line in FIG. 1).

Nevertheless, this method has at least the following drawbacks. First, when the test wafer CD value is used to judge the input value of exposure time for the batch production wafers in the identical group, the problem of response delay would occur. In the operation of the two independent groups, when one batch test wafer in one group is examined and determined to require large-scale adjustments upon the exposure condition, the adjustments cannot be instantly applied to the other group. In other words, such an approach cannot immediately determine whether the batch production wafer of the other group needs the corresponding adjustments upon the exposure time so as to respond to the possible influences by perturbations of the system parameters. For example, when the L(N−2) batch production wafer in the even-batch group is found to have larger system perturbations from examining the T(N−2) batch test wafer, the adjustments to the exposure time are made on the L(N) batch production wafer. However, the L(N−1) batch production wafer in the odd-batch group can not be suitably reflected in time. Actually, it is not until after the T(N−1) batch test wafer has been determined to need adjustment that the adjusted exposure time can be reflected in the L(N+1) batch production wafer. Under such an arrangement, at least two batches of production wafers (i.e., from L(N−2) batch to L(N−1) batch in this example) will be affected when system perturbations take place.

Second, when the test wafer CD value is used to decide whether or not an adjustment upon the exposure time of the next batch production wafer is required, the problem of adjustment fluctuation of the exposure time would arise. In the operation of the two independent groups, when one batch test wafer in one group is examined to need additional adjustments to the exposure condition, the adjustments are directly made on the production line. Yet, for the other group, such adjustments could become an impulse resulting in an adverse effect upon the production in the group and, empirically, such an impulse may merely be excluded by means of system damping.

For instance, assuming that the L(N−2) batch production wafer in the even-batch group is found to have larger system perturbations from examining the T(N−2) batch test wafer, the adjustment to the exposure time on the production line (which is referred to as "a first adjustment quantity") is primarily applied to the L(N) batch production wafer. Similarly, assuming that the T(N−1) batch test wafer is also examined to need adjustments to the exposure condition, the adjustment made on the production line (which is referred to as "a second adjustment quantity") is related to the L(N−1) batch production wafer which does not undergo the first adjustment quantity, rather than to the L(N) batch production wafer which has undergone the first adjustment quantity. Thus, while the second adjustment quantity is applied to the L(N+1) batch production wafer, the total exposure time adjustment on the production line is the second adjustment quantity (which is the exposure time revision required for the L(N−1) batch production wafer) plus the first adjustment quantity (which has already been applied on the production line). Such an arrangement obviously leads to either insufficient or excessive adjustments to the exposure time, and thus the phenomenon of adjustment fluctuation of the exposure time for the production might occur. Such an adjustment fluctuation is unfavorable to the manufacture of the wafer photolithography process.

Accordingly, regardless of the kind of system variation, at least two batches of wafer production are affected. The crux of the problem resides in that, for the conventional system, it is unable effectively either to integrate the production line as well as the inspection line or to evaluate the trend of the system perturbations in such a way that the system perturbations and the exposure condition input are limited to the characteristics of the two batch groups.

In the case that the parameter or system perturbations are relative small, the process yield is not affected. On the other hand, if the perturbations are substantial, the process yield is materially affected. While the perturbations affect the process yield, the adjustment by either on-line adjustment or shutdown for maintenance is both labor-intensive and costly.

BRIEF SUMMARY OF THE INVENTION

Embodiments of the present invention relate to a method for determining the exposure time of a wafer photolithography process, which can capture the trend of parameter variations of the entire system in the wafer photolithography process by integrating the historical records of the test wafers so as to promptly make adjustments that are desirably conservative adjustments upon the exposure time.

It is another feature of the present invention to provide a method for determining the exposure time of a wafer photolithography process, which can be used prevent the yield of the photolithography process from fluctuation and thus avoid possible reworking by means of applying conservative adjustments of the exposure time so as to effectively solve the problems arising from the use of two independent batch groups in the prior art.

It is a further feature of the present invention to provide a system for determining the exposure time of a wafer photolithography process so as to effectively carry out the method for determining the exposure time of a wafer photolithography process of this invention.

An aspect of the present invention is directed to a method for determining an exposure time of a wafer photolithography process, which is applied to a wafer photolithography system. The system includes a production line and an inspection line. The production line proceeds in turn with the photolithography processes upon a plurality of batch production wafers ( . . . L(N−4), L(N−3), L(N−2), L(N−1), L(N), . . . where N denotes a batch number). The inspection line samples in turn the batch production wafers after completion of the photolithography processes from the production line to fabricate corresponding batch test wafers ( . . . T(N−4), T(N−3), T(N−2), T(N−1), T(N), . . . ). Each of the batch test wafers corresponds to one exposure time for producing a corresponding batch production wafer. The batch test wafer generates a respective test value for comparison with a qualified examination value. The method for determining the exposure time of the L(N) batch production wafer comprises recalling in a time sequence at least three batches of the batch test wafers prior to the L(N) batch production wafer and obtaining corresponding test values for the at least three batches of the batch test wafers; calculating a mean value of the test values corresponding to the at least three batches of the batch test wafers with a predetermined mathematical model; comparing the mean value with the qualified examination value and determining a margin value between the mean value and the qualified examination value to adjust and generate an appropriate process exposure time; and employing the process exposure time as the exposure time of the L(N) batch production wafer.

The method may further include a sampling criterion so as to remove distinctive numerical errors caused by any human or non-human factors. For example, recalling the at least three batches of the batch test wafers comprises, when the difference of the test value corresponding to one of the batch test wafers from the qualified examination value goes beyond a predetermined tolerance, excluding the batch test wafer from the at least three batches. Furthermore, the method may include a function of alarming, which is able to instantly notify on-site operators while the system suffers a distinctive error so that the operators can proceed with the trouble shooting to locate the cause of such a distinctive error and may immediately proceed with either maintenance of the system or revision of parameters so as to avoid further propagation of the unfavorable influences. For example, when the difference of the test value corresponding to the batch test wafer from the qualified examination value going beyond another predetermined tolerance is detected, an alarm signal is generated.

In specific embodiments, the predetermined mathematical model may be a calculation model of an arithmetical mean, a calculation model of a geometrical mean, a calculation model of a weighting average, or some other models. Recalling the at least three batches of the batch test wafers prior to the L(N) batch production wafer comprises recalling the T(N−3), T(N−4) and T(N−5) batch test wafers. The appropriate process exposure time may be adjusted and generated by adjusting the exposure time used to produce the L(N−1) batch production wafer by the margin value. The appropriate process exposure time may be adjusted and generated by adjusting the exposure time used to produce the L(N−2) batch production wafer by the margin value. The appropriate process exposure time may be adjusted and generated by obtaining an average exposure time of the exposure times respectively corresponding to the test values of the at least three batches of the batch test wafers with the predetermined mathematical model, and adjusting the average exposure time by means of the margin value and to generate the process exposure time.

In accordance with another aspect of the invention, the method for determining the exposure time of the L(N) batch production wafer comprises comparing the test value corresponding to each of the batch test wafers with a qualified examination value and determining a margin value between the test value and the qualified examination value to adjust the exposure time used for the batch production wafer corresponding to the batch test wafer to be an estimated exposure time; recalling in time sequence at least three batches of the batch test wafers prior to the L(N) batch production wafer and obtaining the corresponding estimated exposure times; calculating a mean value of the estimated exposure times corresponding to the at least three batches of the batch test wafers with a predetermined mathematical model; and employing the mean value as the exposure time of the L(N) batch production wafer.

Another aspect of the present invention is directed to a system for determining an exposure time of a wafer photolithography process, which is applied to a wafer photolithography system. The system for determining the exposure time of the wafer photolithography process comprises a qualification determining unit, which is connected to the inspection line and is configured to receive the test value and the exposure time corresponding to each of the batch test wafers and to compare the test value with a qualified examination value. A storing unit is connected to the qualification determining unit and is configured to store the test value and the exposure time corresponding to the batch test wafer. A parameter determining unit is connected to the storing unit and is used to recall in time sequence and obtain the test values and the exposure times corresponding to at least three batches of the batch test wafers stored in the storing unit, to determine a process exposure time from the test values and the exposure times with a predetermined mathematical model, and then to transmit the process exposure time to the production line for employment.

In some embodiments, the storing unit is configured to store the test value and the exposure time corresponding to the batch test wafer whose test value differs from the qualified examination value within a predetermined tolerance. An alarming unit is connected to the qualification determining unit and is configured to generate an alarm signal when detecting that the difference of the test value of the batch test wafer from the qualified examination value goes beyond another predetermined tolerance.

DETAILED DESCRIPTION OF THE INVENTION

The invention disclosed herein is directed to a method for determining the exposure time of a wafer photolithography process and a system for the same. In the following description, numerous details are set forth in order to provide a thorough understanding of the present invention. It will be appreciated by one skilled in the art that variations of these specific details are possible while still achieving the results of the present invention. In addition, well-known components are not described in detail in order not to unnecessarily obscure the present invention.

The method for determining the exposure time of a wafer photolithography process is applied to a wafer photolithography system. In specific embodiments, the main design concept lies in utilizing a conservative estimated adjustment to the exposure time to encompass possible minute perturbations in the photolithography process and to reduce or impede the unfavorable influences on the process from any unpredictable distinctive perturbations of the system.

The photolithography system, which may be the same as mentioned in the background, includes a production line and an inspection line. The production line proceeds in turn with the photolithography processes of a plurality of batch production wafers ( . . . L(N−4), L(N−3), L(N−2), L(N−1), L(N), . . . where N denotes batch number), and the inspection line samples in turn the batch production wafers after completion of the photolithography processes from the production line to fabricate corresponding batch test wafers ( . . . T(N−4), T(N−3), T(N−2), T(N−1), T(N), . . . ). Moreover, each of the batch test wafers corresponds to an exposure time for producing a corresponding batch production wafer, and each of the batch test wafer generates a test value (which can be the above-mentioned CD value or other numerical values capable of being an examining standard) for comparison with a standard or qualified examination value.

The method for determining the exposure time of the wafer photolithography process of this invention is used to determine the preferred exposure time employed to the L(N) batch production wafer.

Figure 2:
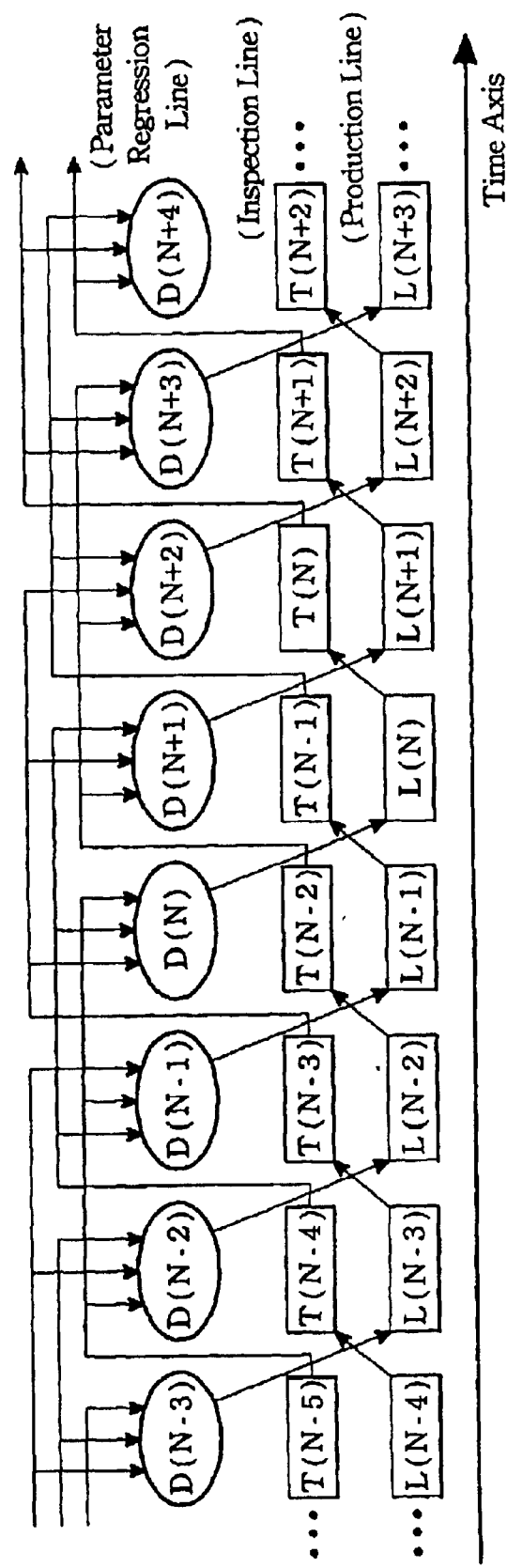
FIG. 2 is a schematic diagram of the time sequential relationship of the wafer photolithography production line to the test wafer inspection line among batches by employing the method of determining the exposure time of the wafer photolithography process in accordance with one embodiment of the present invention.

FIG. 2 is a schematic diagram of the time sequential relationship of the wafer photolithography production line to the test wafer inspection line among batches by employing the method of determining the exposure time of the wafer photolithography process in accordance with one embodiment of the present invention.

Figure 1:
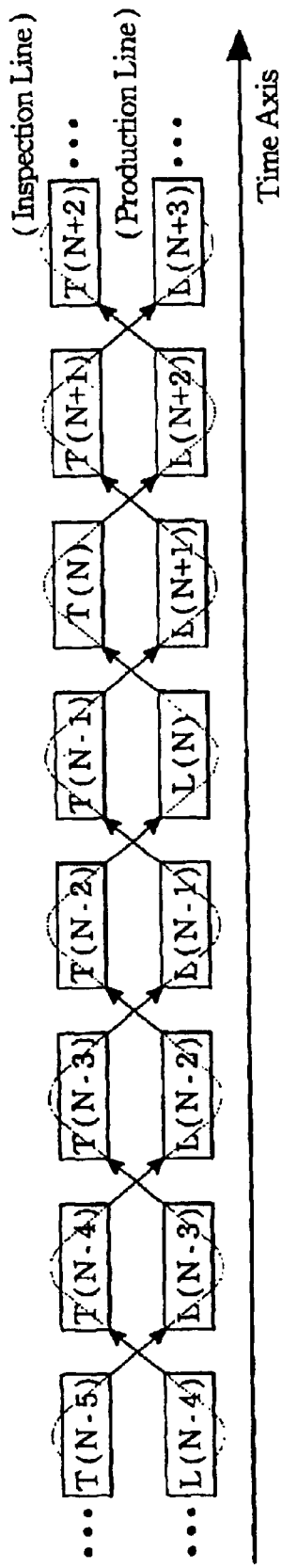
FIG. 1 is a schematic diagram of the time sequential relationship of the wafer photolithography production line to the test wafer inspection line among batches in the prior art.

In comparison with the prior art as depicted in FIG. 1, FIG. 2 shows that when the present method is employed, a parameter regression line is built up in the wafer photolithography system in order to collect the information about examination and parameters on the inspection line, to eliminate the characteristics or phenomenon of the two independent groups as shown in FIG. 1 by means of mingled utilization of such information, and to generate the preferred exposure time employed to the production line according to the information of at least three batches (three batches are shown in FIG. 2).

Figure 3:
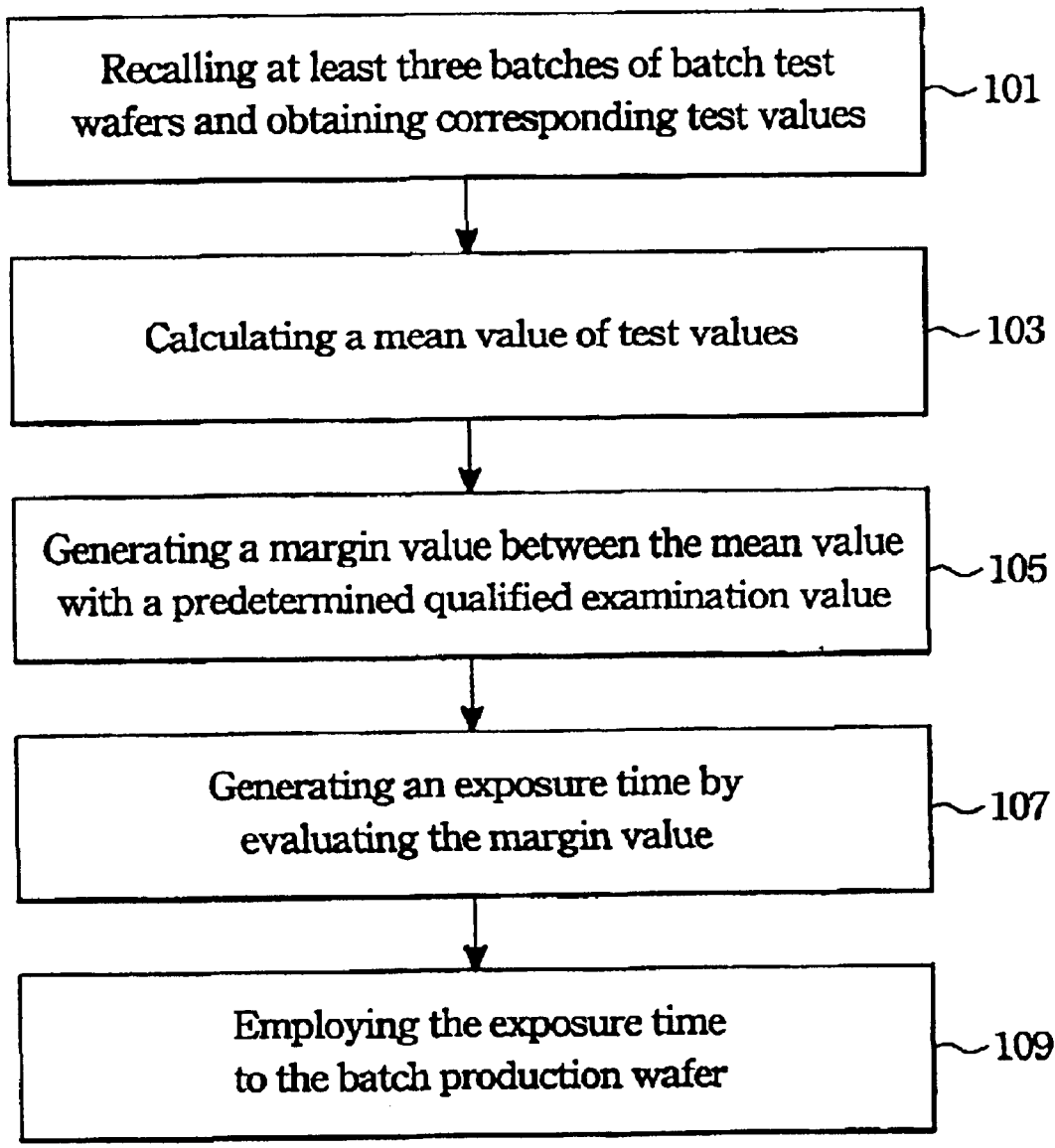
FIG. 3 is a flow chart of the method of determining the exposure time of the wafer photolithography process in accordance with one embodiment of the present invention.

FIG. 3 is a flow chart of the method of determining the exposure time of the wafer photolithography process in accordance with one embodiment of the present invention. The determination of the exposure time of the L(N) batch production wafer involves recalling in a time sequence at least three batches of the batch test wafers and to obtain the corresponding test values (step 101), that is, at least looking back at the T(N−3), T(N−4) and T(N−5) batch test wafers.

Subsequently, in step 103, a mean value of the test values corresponding to the at least three batches of the batch test wafers is calculated with a predetermined mathematical model. For example, the predetermined mathematical model processing an average operation of the test values can be a calculation model of an arithmetical mean, a calculation model of a geometrical mean, a calculation model of a weighting average (i.e., different percentages applied to the respective test values), or the other calculation models.

In step 105, the calculated mean value is compared with a predetermined qualified examination value to generate a margin value between the mean value and the qualified examination value.

In step 107, the margin value between the mean value and the qualified examination value is then used to adjust and generate an appropriate process exposure time.

Finally, in step 109, the preferred process exposure time is employed as the exposure time for the L(N) batch production wafer.

In step 101 of this embodiment, a condition of test value selection can also be included so as to remove distinctive errors due to any man-made or non-artificial factors. The following condition of test value selection may be employed: when the difference of the test value corresponding to one of the batch test wafers from the qualified examination value goes beyond a predetermined tolerance (for example, about thirty percentage of the qualified examination value, or other numerical ranges), the present determining method will not incorporate the test value obtained from the batch test wafer and the corresponding exposure time into calculation.

Furthermore, this embodiment of the present invention can also include a function of alarming, which is able to instantly notify on-site operators while the system suffers a distinctive error so that the operators can proceed with the trouble shooting in order to find out the cause of such a distinctive error and may immediately respond with either maintenance of the system or revision of the parameters so as to avoid the continuously enlarging unfavorable influences. The following function of alarming may be employed: when the difference of the test value corresponding to the batch test wafer from the qualified examination value going beyond another predetermined tolerance (for example, fifty percentage of the qualified examination value, or other numerical ranges) is detected, an alarm signal is generated.

In step 107 of this invention, to adjust and generate an appropriate process exposure time may involve adjusting the exposure time used in producing the L(N−1) batch production wafer by means of the margin value between the mean value and the qualified examination value as the process exposure time which is to be used to produce the L(N) batch production wafer. Also, the process exposure time which is to be used to produce the L(N) batch production wafer can employ the exposure time used in producing the L(N−1) batch production wafer as a basis for adjustments by means of the margin value between the mean value and the qualified examination value. Further, the process exposure time which is to be used to produce the L(N) batch production wafer can employ an average operation value of the exposure times respectively corresponding to the at least three test values as the basis for adjustments, where the average operation method of the exposure times may be a calculation model of an arithmetical mean, a calculation model of a geometrical mean, a calculation model of a weighting average, or other calculation models.

In this invention, the gain adjustment to the former exposure time (e.g. the exposure time used in producing the L(N−1) or L(N−2) batch production wafer) through the margin value between the mean value of the test values and the qualified examination value can be made based on a linear function, or other functions or characteristics according to the actual practice.

Figure 4:
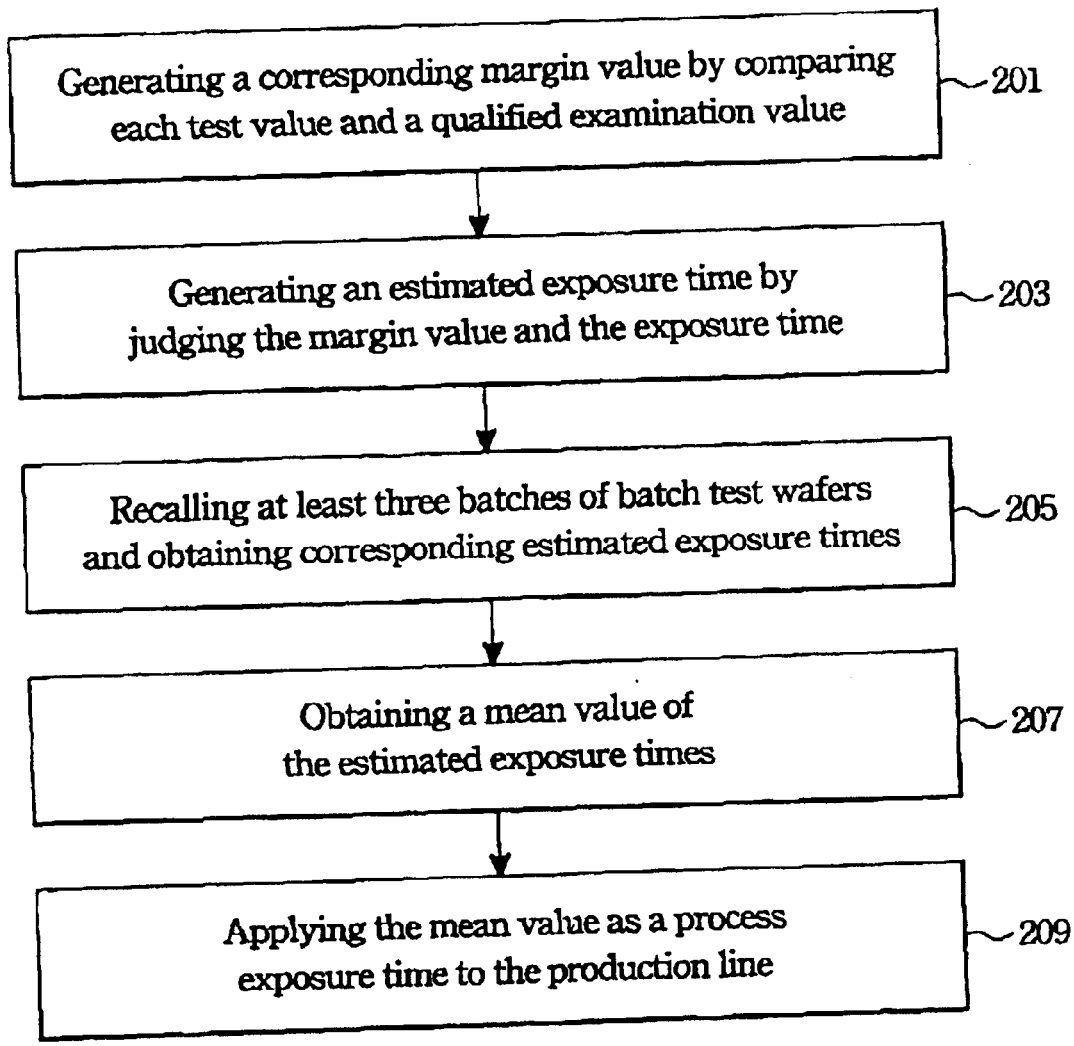
FIG. 4 is a flow chart of the method of determining the exposure time of the wafer photolithography process in accordance with another embodiment of the present invention.

FIG. 4 is a flow chart of the method of determining the exposure time of the wafer photolithography process in accordance with another embodiment of the present invention. The determination of the exposure time of the L(N) batch production wafer involves, first of all (step 201), comparing the test value corresponding to each of the batch test wafers with a qualified examination value and respectively to generate a corresponding margin value.

In step 203, the margin value between the test value and the qualified examination value is determined and employed to adjust the exposure time, which is used for the batch production wafer corresponding to the batch test wafer as an estimated exposure time. The gain adjustments to the exposure time through the margin value can be made based on a linear function, or other functions or characteristics according to the actual practice.

In step 205, at least three batches of the batch test wafers are recalled in time sequence and the corresponding estimated exposure times are obtained, i.e., at least the T(N−3), T(N−4) and T(N−5) batch test wafers are used to determine the estimated exposure times.

In step 207, a mean value of the estimated exposure times corresponding to the at least three batches of the batch test wafers is calculated with a predetermined mathematical model. For example, the predetermined mathematical model can be a calculation model of an arithmetical mean, a calculation model of a geometrical mean, a calculation model of a weighting average (i.e., different percentages applied to the respective test values), or other calculation models.

Finally, in step 209, the mean value is employed as the process exposure time of the L(N) batch production wafer.

The main difference between this embodiment illustrated in FIG. 4 and the previous embodiment of FIG. 3 resides in that an estimation of a preferred exposure time according to the test value is first performed in this embodiment and the process exposure time is then obtained by directly averaging at least three estimated exposure times. On the other hand, the first embodiment first calculates the average of the test values and then obtains the process exposure time. Except for the above-mentioned difference, the other procedures of these two embodiments can be performed in the same manner.

Figure 5:
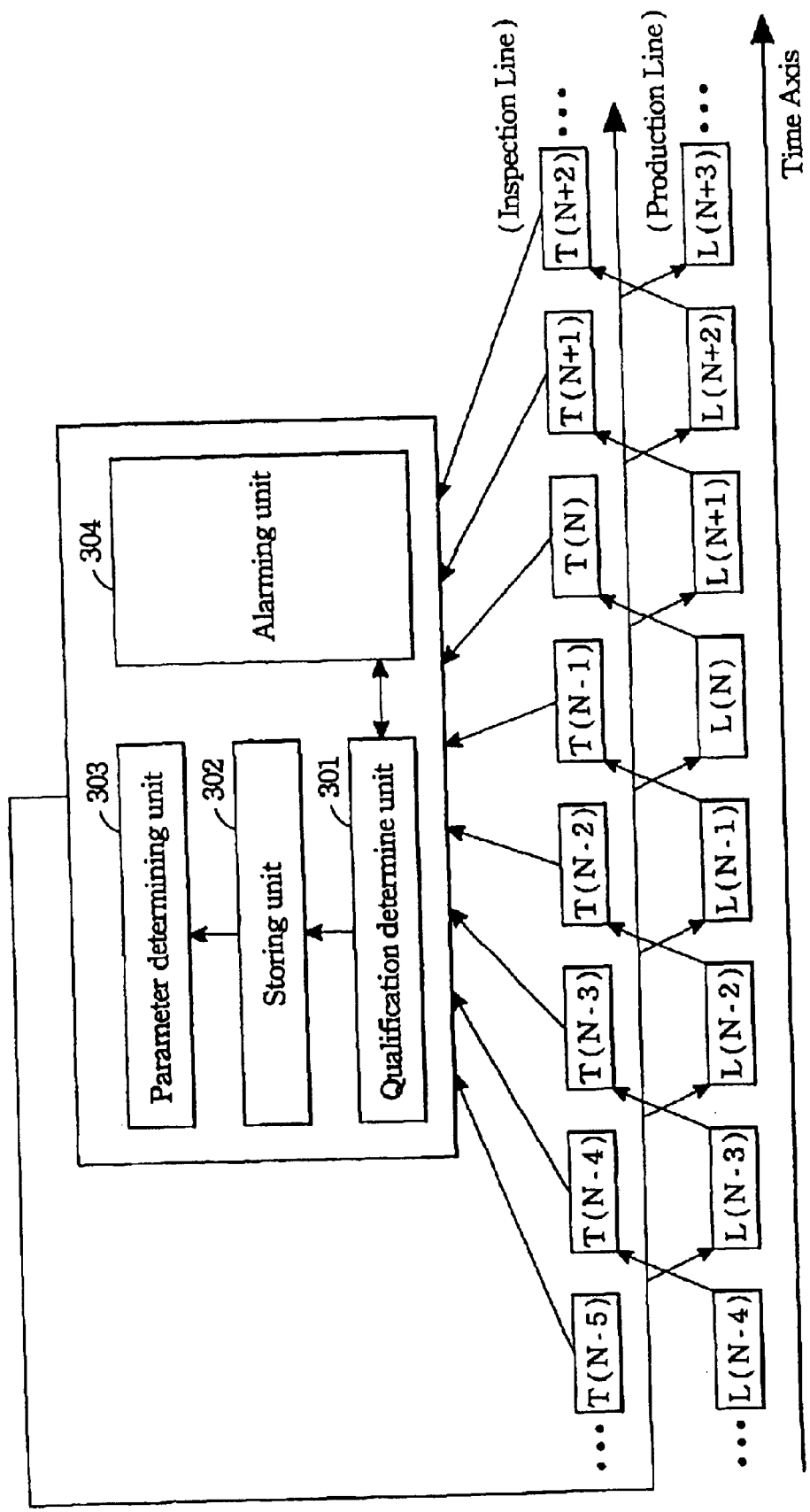
FIG. 5 is a schematic diagram of the relationship of the system for determining the exposure time of the wafer photolithography process, in accordance with one embodiment of the present invention, to the wafer photolithography production line and the test wafer inspection line.

FIG. 5 is a distribution block diagram of the system for determining the exposure time of the wafer photolithography process in accordance with an embodiment of the present invention. The system is mainly used to perform the method for determining the exposure time of the wafer photolithography process of the present invention, and comprises a qualification determining unit 301, a storing unit 302, and a parameter determining unit 303.

The qualification determining unit 301 is connected to the inspection line of the photolithography system, and is used to receive the test value and the exposure time corresponding to each of the batch test wafers and to compare the received test value with a qualified examination value.

The storing unit 302 is connected to the qualification determining unit 301, and is used to store the test value and the exposure time corresponding to the batch test wafer whose test value differs from the qualified examination value within a predetermined tolerance for use in the calculation of the process exposure time.

The parameter determining unit 303 is connected to the storing unit 302, and is used to recall in time sequence and obtain the test values and the exposure times corresponding to at least three batches of the batch test wafers stored in the storing unit 302, to determine a process exposure time from the test values and the exposure times according to the aforesaid method of this invention, and then to transmit the process exposure time to the production line of the photolithography system for employment.

In some embodiments, the system can further comprise an alarming unit 304 which is connected to the qualification determining unit 301 and generates an alarm signal to warn on the-spot operators when it detects that the difference of the test value of the batch test wafer from the qualified examination value has gone beyond another predetermined tolerance.

How to determine the primary process exposure time in the beginning of the photolithography process is not mentioned in the above, due to the lack of literatures for the method of determining such primary process exposure time. Nevertheless, numerous conventional methods for such a determination are available, for example, using a predetermined exposure time as the primary process exposure time, or forming the primary process exposure time by other flexible ways.

The above-described arrangements of apparatus and methods are merely illustrative of applications of the principles of this invention and many other embodiments and modifications may be made without departing from the spirit and scope of the invention as defined in the claims. The scope of the invention should, therefore, be determined not with reference to the above description, but instead should be determined with reference to the appended claims along with their full scope of equivalents.

What is claimed is:

1. A method for determining an exposure time of a wafer photolithography process, which is applied to a wafer photolithography system, said system including a production line and an inspection line, said production line proceeding in turn with said photolithography processes upon a plurality of batch production wafers ( . . . L(N−4), L(N−3), L(N−2), L(N−1), L(N), . . . where N denotes a batch number), said inspection line sampling in turn said batch production wafers after completion of said photolithography processes from said production line to fabricate corresponding batch test wafers ( . . . T(N−4), T(N−3), T(N−2), T(N−1), T(N), . . . ), each of said batch test wafers corresponding to one said exposure time for producing a corresponding batch production wafer, said batch test wafer generating a respective test value for comparison with a qualified examination value, said method for determining said exposure time of said L(N) batch production wafer comprising:

recalling in a time sequence at least three batches of said batch test wafers prior to said L(N) batch production wafer and obtaining corresponding test values for said at least three batches of said batch test wafers;

calculating a mean value of said test values corresponding to said at least three batches of said batch test wafers with a predetermined mathematical model;

comparing said mean value with said qualified examination value and determining a margin value between said mean value and said qualified examination value to adjust and generate an appropriate process exposure time; and employing said process exposure time as said exposure time of said L(N) batch production wafer.

2. The method of claim 1 wherein recalling said at least three batches of said batch test wafers comprises, when the difference of said test value corresponding to one of said batch test wafers from said qualified examination value goes beyond a predetermined tolerance, excluding said batch test wafer from said at least three batches.

3. The method of claim 2 wherein when the difference of said test value corresponding to said batch test wafer from said qualified examination value going beyond another predetermined tolerance is detected, an alarm signal is generated.

4. The method of claim 1 wherein said predetermined mathematical model is a calculation model of an arithmetical mean.

5. The method of claim 1 wherein said predetermined mathematical model is a calculation model of a geometrical mean.

6. The method of claim 1 wherein said predetermined mathematical model is a calculation model of a weighting average.

7. The method of claim 1 wherein recalling said at least three batches of said batch test wafers prior to said L(N) batch production wafer comprises recalling said T(N−3), T(N−4) and T(N−5) batch test wafers.

8. The method of claim 1 wherein said appropriate process exposure time is adjusted and generated by adjusting said exposure time used to produce said L(N−1) batch production wafer by said margin value.

9. The method of claim 1 wherein said appropriate process exposure time is adjusted and generated by adjusting said exposure time used to produce said L(N−2) batch production wafer by said margin value.

10. The method of claim 1 wherein said appropriate process exposure time is adjusted and generated by obtaining an average exposure time of said exposure times respectively corresponding to said test values of said at least three batches of said batch test wafers with said predetermined mathematical model, and adjusting said average exposure time by means of said margin value and to generate said process exposure time.

11. A method for determining an exposure time of a wafer photolithography process, which is applied to a wafer photolithography system, said system including a production line and an inspection line, said production line proceeding in turn with said photolithography processes upon a plurality of batch production wafers ( . . . L(N−4), L(N−3), L(N−2), L(N−1), L(N), . . . where N denotes a batch number), said inspection line sampling in turn said batch production wafers after completion of said photolithography processes from said production line to fabricate corresponding batch test wafers ( . . . T(N−4), T(N−3), T(N−2), T(N−1), T(N), . . . ), each of said batch test wafers corresponding to an exposure time for producing said corresponding batch production wafer, said batch test wafer generating a respective test value, said method for determining said exposure time of said L(N) batch production wafer comprising:

comparing said test value corresponding to each of said batch test wafers with a qualified examination value and determining a margin value between said test value and said qualified examination value to adjust said exposure time used for said batch production wafer corresponding to said batch test wafer to be an estimated exposure time;

recalling in time sequence at least three batches of said batch test wafers prior to said L(N) batch production wafer and obtaining said corresponding estimated exposure times;

calculating a mean value of said estimated exposure times corresponding to said at least three batches of said batch test wafers with a predetermined mathematical model; and employing said mean value as said exposure time of said L(N) batch production wafer.

12. The method of claim 11 wherein recalling said at least three batches of said batch test wafers comprises, when the difference of said test value corresponding to one of said batch test wafers from said qualified examination value goes beyond a predetermined tolerance, excluding said batch test wafer from said at least three batches.

13. The method of claim 12 wherein when the difference of said test value corresponding to said batch test wafer from said qualified examination value going beyond another predetermined tolerance is detected, an alarm signal is generated.

14. The method of claim 11 wherein said predetermined mathematical model is one of a calculation model of an arithmetical mean, a calculation model of a geometrical mean, and a calculation model of a weighting average.

15. The method of claim 11 wherein recalling said at least three batches of said batch test wafers prior to said L(N) batch production wafer comprises recalling said T(N−3), T(N−4) and T(N−5) batch test wafers.

16. A system for determining an exposure time of a wafer photolithography process, which is applied to a wafer photolithography system, said photolithography system including a production line and an inspection line, said production line proceeding in turn with said photolithography processes of a plurality of batch production wafers ( . . . L(N−4), L(N−3), L(N−2), L(N−1), L(N), . . . where N denotes a batch number), said inspection line sampling in turn said batch production wafers after completion of said photolithography processes from said production line to fabricate corresponding batch test wafers ( . . . T(N−4), T(N−3), T(N−2), T(N−1), T(N), . . . ), each of said batch test wafers corresponding to an exposure time for producing said corresponding batch production wafer, said batch test wafer generating a respective test value, said system for determining said exposure time of said wafer photolithography process comprising:

a qualification determining unit, which is connected to said inspection line and is configured to receive said test value and said exposure time corresponding to each of said batch test wafers and to compare said test value with a qualified examination value;

a storing unit, which is connected to said qualification determining unit and is configured to store said test value and said exposure time corresponding to said batch test wafer; and a parameter determining unit, which is connected to said storing unit and is used to recall in time sequence and obtain said test values and said exposure times corresponding to at least three batches of said batch test wafers stored in said storing unit, to determine a process exposure time from said test values and said exposure times with a predetermined mathematical model, and then to transmit said process exposure time to said production line for employment.

17. The system of claim 16 wherein said storing unit is configured to store said test value and said exposure time corresponding to said batch test wafer whose test value differs from said qualified examination value within a predetermined tolerance.

18. The system of claim 17 further including an alarming unit which is connected to said qualification determining unit and is configured to generate an alarm signal when detecting that the difference of said test value of said batch test wafer from said qualified examination value goes beyond another predetermined tolerance.

19. The system of claim 16 wherein the parameter determining unit is configured to recall said T(N−3), T(N−4) and T(N−5) batch test wafers.

20. The system of claim 16 wherein said predetermined mathematical model of said parameter determining unit is one of a calculation model of an arithmetical mean, a calculation model of a geometrical mean, and a calculation model of a weighting average.

* * * * *